TEMPERATURE COMPENSATED TRANSISTOR AMPLIFIER
Filed Aug. 24, 1956
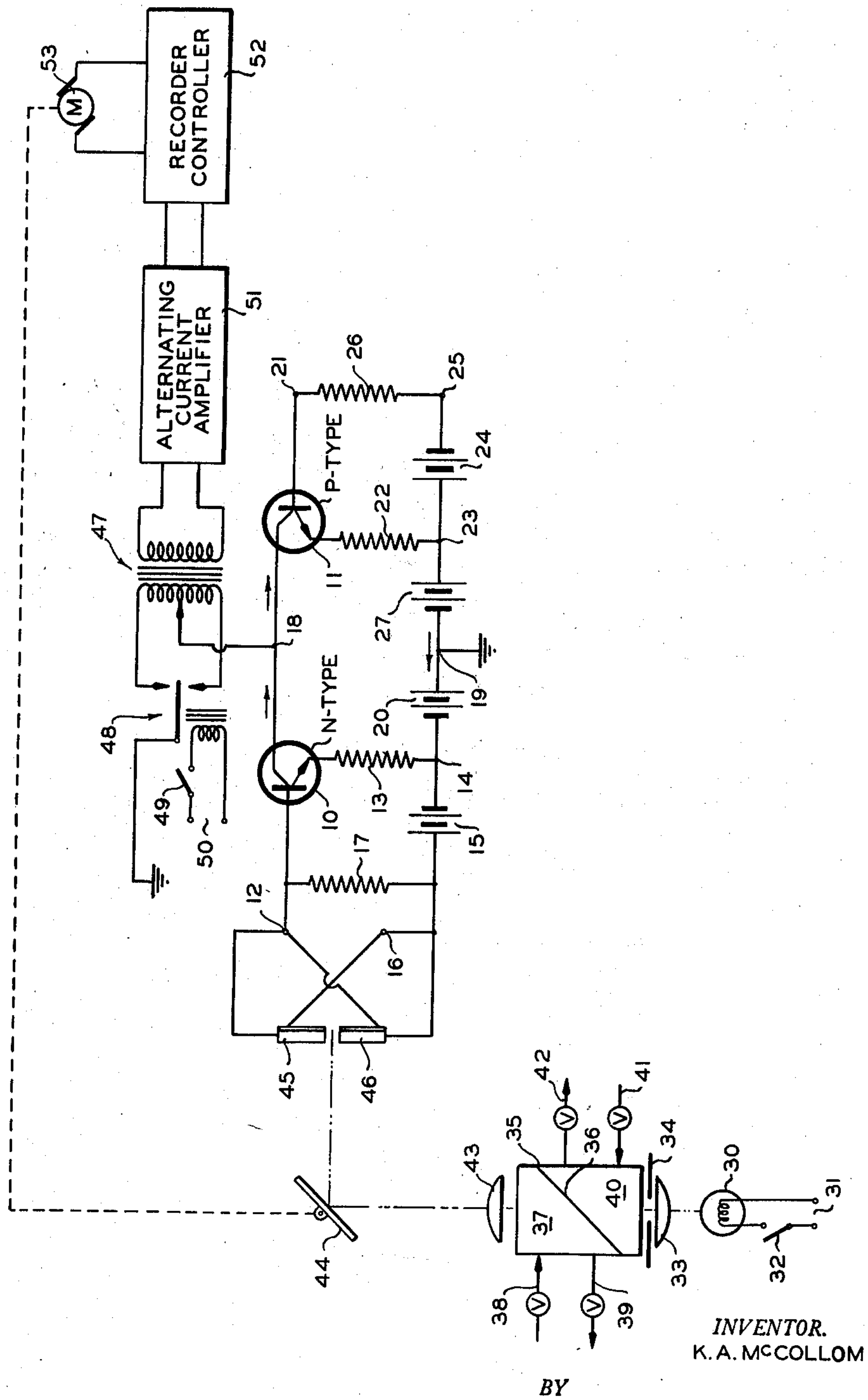
INVENTOR.
K. A. McCOLLOM
BY
Hudson & Young
ATTORNEYS United States Patent Office 2,945,187
Patented July 12, 1960

2,945,187

TEMPERATURE COMPENSATED TRANSISTOR AMPLIFIER

Kenneth A. McCollom, Bartlesville, Okla., assignor to Phillips Petroleum Company, a corporation of Delaware Filed Aug. 24, 1956, Ser. No. 605,972

1 Claim. (Cl. 330—24)

This invention relates to transistor circuits wherein a unit of the "N" type and a transistor of the "P" type are connected in opposition.

It has been found that the amplifying characteristics of vacuum tubes can be reproduced to a considerable extent by transistors, either of the point contact type wherein the emitter and collector are point contacts bearing against a semi-conductive body and the base is a substantially ohmic connection to the body, or of the junction type wherein the semi-conductive body comprises a zone of one conductivity type between and contiguous with two zones of the opposite conductivity type, the base connection being made to the intermediate zone with the emitter and collector connections to the outer zones.

While the action of transistors resembles that of vacuum tubes in some respects, there are many substantial points of difference. In particular, the relationship between input and output current varies considerably with temperature. Heretofore, this has somewhat limited the usefulness of transistors at temperatures above room temperature.

In accordance with this invention, an "N" type and a "P" type transistor are connected in opposition with a fixed load connected to the "P" type transistor. Thus, changes in the transistor characteristic due to temperature affect both transistors equally, and the temperature effect is cancelled out due to the opposing connection of the transistors. For purposes of this specification, an "N" type transistor is defined as one wherein current flows into the emitter and out of the collector, application of a positive voltage to the emitter tending to drive the transistor toward saturation. A "P" type transistor is defined as one wherein the current flows into the collector and out of the emitter, a positive potential at the emitter tending to drive the transistor toward cutoff.

It is a feature of the invention that, by application of an input voltage to the "P" type transistor, a differential amplifier is obtained with substantial preservation of the temperature compensation advantage. The temperature compensated amplifier circuit of the invention has wide utility, and one advantageous use being in an analytical instrument, such as a differential refractometer.

It is an object of the invention to provide an improved transistor amplifier which is temperature compensated, and which can be utilized as a differential amplifier.

It is a further object to provide an analytical instrument embodying such novel amplifier.

It is a still further object to provide a circuit which is reliable in operation, produces a very linear relation between input and output current, and which produces a zero load current with a zero input current.

Various other objects, advantages and features of the invention will become apparent from the following detailed description taken in conjunction with the accompanying drawings, in which the figure is a schematic circuit diagram of the amplifier of the invention incorporated in a differential refractometer.

Referring now to the drawing in detail, the circuit includes an "N" type transistor 10 and a "P" type transistor 11. The base of the transistor 10 is connected to an input terminal 12 while the emitter is connected through a fixed resistance 13, terminal 14 and bias source 15 to another input terminal 16, the input terminals having an input resistance 17 connected thereacross. The collector of the transistor 10 is connected to an output terminal 18, and the other output terminal 19 is connected through a battery or other current source 20 to the terminal 14.

The base of the transistor 11 is connected to an input terminal 21 while the emitter is connected through a fixed resistance 22, a terminal 23 and a bias battery or other source of bias voltage 24 to an input terminal 25, the terminals 21, 25 having a fixed resistance 26 connected thereacross. The collector of the transistor 11 is connected to the output terminal 18, and the output terminal 19 is connected through a battery or other current source 27 to the terminal 23.

In operaion of the circuit as a temperature-compensated amplifier, an input is applied to the terminals 12, 16, and this input is amplified by the transistor 10 and appears across the output terminals 18, 19. A fixed input or bias is supplied to the transistor 11, resulting in the appearance of a potential at the output terminals 18 and 19. Since transistor 10 is of the "N" type while transistor 11 is of the "P" type, the output currents flow in different directions through the load connected to the output terminals with the result that these currents oppose each other. Should the temperature increase, the current through transistor 10 likewise increases but there is a similar increase in current through the transistor 11 resulting from the increase in temperature so that the net effect upon the output current through the load is zero. An opposite effect occurs if the temperature decreases, the resulting decrease in current flow through the "N" type transistor being offset by a corresponding decrease in current flow through the "P" type transistor 11. It will thus be apparent that I have achieved a major object of the invention in providing a temperature-compensated transistor amplifier.

It is a further feature of the circuit, as shown, that there is no flow of output current when the input current is zero. This is a very substantial advantage which is not found in the conventional single-ended transistor. Moreover, the relationship between the input and output currents is substantially straigh-line for output currents as high as 15 to 20 milliamperes. In fact, even at temperatures at 137° F., this linear relationship is obtained up to currents of 5 milliamperes where the usual single ended amplifier at that temperature exhibits no variation of output current at all responsive to variations in input current. Thus, in addition to the temperature-compensation feature, the described circuit has a number of other significant advantages.

If an input signal is applied to the terminals 21, 25, the circuit functions as a differential amplifier with substantial preservation of the temperature-compensation feature. Similarly, if an input signal is applied to the terminals 21, 25 but not to the terminals 12, and 16, the circuit functions as a temperature-compensated amplifier, the output of which is the complement of the input.

In the system illustrated in Figure 1, the amplifier circuit is utilized in a differential refractometer instrument. This includes a source 30 of visible radiation connected to a current supply 31 by a switch 32. Radiation from the source 30 passes through a lens 33, slit assembly 34 and cell 35. This cell is divided into two portions by a partition 36, a sample being introduced into the chamber 37 by a valved line 38 and withdrawn by a valved line 39 while a standard fluid is introduced into the chamber 40 by a valved line 41 and withdrawn by a valved line 42.

From the cell, the radiation beam passes through the lens 43 and is reflected by a movable mirror 44 onto a pair of photoelectric cells 45, 46, which are connected in opposition to the input terminals 12 and 16.

The output terminal 18 is connected to a center tap on the primary winding of a transformer 47, the end terminals of which are connected to fixed contact points of a vibratory interrupter 48, the reed of which is grounded. The driver coil of the interrupter is connected by a switch 49 to a current source 50.

The secondary winding of the transformer 47 is connected to an alternating current amplifier 51, the output of which, in turn, is fed to a recorder controller device 52 actuating a servomotor 53. This servomotor is mechanically connected to the rotatable mirror 44.

In operation, radiation passing through the cell assembly is deflected in accordance with the difference in refractive index between the sample fluid in cell 37 and the standard fluid in cell 40. A change in the refractive index of the sample fluid causes the beam to deflect producing an unbalaced voltage in the cell circuit 45, 46 which is amplified by the novel transistor amplifier and fed to the recorder through the vibratory interrupter 48 and the amplifier 51. This signal causes servomotor 53 to move the mirror 44 until the beam returns to a neutral position between the two photoelectric cells. As a result, the position of the servomotor shaft and mirror 44 is continuously representative of the difference in refractive index between the sample fluid and the standard fluid, which difference is indicated by the recorder 52, for example, upon a chart or other suitable recording medium.

In this application, the transistor amplifier functions as a very small and compact lightweight preamplifier which efficiently amplifies the signal from the photocell circuit to an amplitude where it can be passed through the interrupter to the alternating current amplifier 51. As it is necessary that the preamplifier be located close to the photoelectric cells due to the very small output of the photoelectric tubes, the compactness and small size of the amplifier are of considerable advantage. Also, since the amplifier is passed close to process equipment, it is subject to considerable temperature variation. Accordingly, the temperature-compensation feature of the invention is of very considerable advantage in this application.

While the invention has been described in connection with present, preferred embodiments thereof, it is to be understood that this description is illustrative only and is not intended to limit the invention.

I claim:

A transistor circuit comprising, in combination, an "N" type transistor having a base, collector, and emitter electrodes; a "P" type transistor having base, collector and emitter electrodes; a fixed resistance, a first direct current bias source, and an input resistance connected in series between the emitter and base of said "N" type transistor; a pair of input terminals connected across said last-mentioned resistance; a fixed resistance, a second direct current bias source, and a fixed resistance connected in series between the emitter and base of said "P" type transistor; a pair of output terminals; leads connecting one of said pair of output terminals to the collector electrode of both transistors; a third direct current bias source of one polarity connecting the other output terminal of said pair to the junction between said first bias source and the first resistance adjoining the emitter of said "N" type transistor; and a fourth direct current bias source of opposite polarity connecting said other output terminal to the junction between said second bias source and the fixed resistance connected to the emitter of said "P" type transistor.

References Cited in the file of this patent

UNITED STATES PATENTS

| | | |
|---|---|---|
| 2,531,458 | Nye | Nov. 28, 1950 |
| 2,666,818 | Shockley | Jan. 19, 1954 |
| 2,666,819 | Raisbeck | Jan. 19, 1954 |
| 2,724,304 | Crawford | Nov. 22, 1955 |
| 2,747,455 | Spracklen et al. | May 29, 1956 |
| 2,762,870 | Sziklai et al. | Sept. 11, 1956 |
| 2,791,644 | Sziklai | May 7, 1957 |
| 2,859,402 | Schaeve | Nov. 4, 1958 |
| 2,900,215 | Schoen | Aug. 18, 1959 |